(12) United States Patent
Lin

(10) Patent No.: US 7,014,708 B2
(45) Date of Patent: Mar. 21, 2006

(54) METHOD OF FORMING A THIN FILM TRANSISTOR BY UTILIZING A LASER CRYSTALLIZATION PROCESS

(75) Inventor: Ching-Wei Lin, Tao-Yuan Hsien (TW)

(73) Assignee: Toppoly Optoelectronics Corp., Miao-Li (TW)

( * ) Notice: Subject to any disclaimer, the term of this patent is extended or adjusted under 35 U.S.C. 154(b) by 0 days.

(21) Appl. No.: 10/709,980

(22) Filed: Jun. 10, 2004

(65) Prior Publication Data

US 2004/0250754 A1     Dec. 16, 2004

(30) Foreign Application Priority Data

Jun. 12, 2003  (TW) ............................... 92116013 A

(51) Int. Cl.
*C30B 25/12*    (2006.01)

(52) U.S. Cl. ............................. 117/89; 117/92; 117/95; 117/103

(58) Field of Classification Search ................. 117/89, 117/92, 95, 103
See application file for complete search history.

(56) References Cited

U.S. PATENT DOCUMENTS

| 6,265,765 B1 * | 7/2001 | DiStefano et al. .......... 257/678 |
| 6,534,789 B1 * | 3/2003 | Ishida ........................ 257/72 |
| 6,709,905 B1 * | 3/2004 | Kusumoto et al. .......... 438/161 |

* cited by examiner

*Primary Examiner*—Felisa Hiteshew
(74) *Attorney, Agent, or Firm*—Winston Hsu

(57) ABSTRACT

An amorphous silicon pattern is formed first. A first region, a second region, at least one first pointed region adjacent to the second region and having a second height, at least one fourth region between the first region and each first pointed region are included in the amorphous silicon pattern. Each fourth region has a fourth height smaller than the second height. A laser crystallization process is performed to form a first single crystal silicon grain in each fourth region.

25 Claims, 14 Drawing Sheets

METHOD OF FORMING A THIN FILM TRANSISTOR BY UTILIZING A LASER CRYSTALLIZATION PROCESS

BACKGROUND OF INVENTION

1. Field of the Invention

The present invention relates to a method of forming a thin film transistor (TFT), and more particularly, to a method of forming a low temperature polysilicon thin film transistor (LTPS TFT) having improved electrical characteristics and uniformity by utilizing a laser crystallization (LC) process.

2. Description of the Prior Art

Currently, a liquid crystal display (LCD) is the most popular flat panel display technique. The applications for liquid crystal displays are extensive, such as mobile phones, digital cameras, video cameras, notebooks, and monitors. Due to high quality display requirements and the expansion of new application fields, the LCD has developed toward high quality, high resolution, high brightness, and low price. Development of low temperature polysilicon thin film transistors (LTPS TFTs), to be used in active matrix LCD, is a break-through in achieving the above objectives.

Please refer to FIG. 1 to FIG. 4 that are schematic diagrams of fabricating an LTPS-TFT 26 according to the prior art. The prior art LTPS-TFT 26 is fabricated on an insulation substrate 10. The insulation substrate 10, composed of transparent materials, may be a glass substrate or a quartz substrate.

Referring to FIG. 1, an amorphous silicon thin film (a-Si thin film, not shown) is formed on the insulation substrate 10 first. Then an excimer laser annealing (ELA) process is performed to crystallize the amorphous silicon thin film (not shown) into a polysilicon layer 12. The polysilicon layer 12 comprises a source region 13, a drain region 14, and a channel region 15. The polysilicon layer 12, also called an active layer, is used as a channel when the LTPS-TFT 26 is turned on.

Since the quality of the amorphous silicon thin film (not shown) is a determinative factor for the characteristics of the subsequent formed polysilicon layer 12, all of the parameters during the amorphous silicon thin film deposition process need to be strictly controlled. The amorphous silicon thin film with low hydrogen content, high thickness uniformity, and low surface roughness is thus formed. Moreover, the amorphous silicon thin film is melted and crystallized rapidly through absorption of the deep ultra-violet light during the excimer laser annealing process to form the polysilicon layer 12. Such a quick absorption due to the short laser pulse only affects the amorphous silicon thin film and will not affect the insulation substrate 10. Hence, the insulation substrate 10 is kept at a low temperature state.

As shown in FIG. 2, a plasma enhanced chemical vapor deposition (PECVD) process is thereafter performed to form a gate insulating layer ($SiO_x$ layer) 16 having a thickness of 500~1200 angstrom (Å) on the polysilicon layer 12. The gate insulating layer 16 may be single-layered structure, or a composite-layered structure, depending on design requirements. The material composition of the gate insulating layer 16 comprises silane-based silicon oxide ($SiH_4$ based $SiO_x$), tetra-ethyl-ortho-silicate based silicon oxide (TEOS-based $SiO_x$), silicon nitride ($SiN_x$), or silicon oxynitride ($SiO_xN_y$). After that, a first sputtering process is performed to form a metal layer 18 on the gate insulating layer 16. The metal layer 18 may be a tungsten (W) layer, a chrome (Cr) layer, or another conductive metal layer.

As shown in FIG. 3, then a photoresist layer (not shown) is formed on the insulation substrate 10. A photolithography process is thereafter performed to define a gate pattern 22 in the photoresist layer (not shown). The gate pattern 22 is on the channel region 15. After that, a dry etching process is performed to remove portions of the metal layer 18 so as to form a gate 24 of the LTPS-TFT 26 on the gate insulating layer 16.

After removing the gate pattern 22, an ion implantation process is then performed to form a source 28 and a drain 32 of the LTPS-TFT 26, in the source region 13, and in the drain region 14 in the polysilicon layer 12 respectively by utilizing the gate 24 as a mask, as shown in FIG. 4. In the application of the thin film transistor (TFT), the series resistance of the source/drain must be low. An activation process is thus necessarily performed after the ion implantation process to highly activate the dopants in the source 28 and the drain 32. The activation process not only moves the ions to the correct lattice sites but also repairs the lattice defects incurred from the ion implantation process to complete the fabrication of the LTPS-TFT 26.

After completing the LTPS-TFT 26, a dielectric layer 34 is deposited. The dielectric layer 34 may be a single-layered dielectric layer or a composite-layered dielectric layer. Finally a photo-etching-process (PEP) is performed to form a contact hole 36 through the dielectric layer 34 and the gate insulating layer 16, on the source region 13 and the drain region 14 respectively, extending to the source 28 and the drain 32. The contact hole 36 is thereafter filled with conductive materials (not shown) to electrically connect the source 28 and the drain 32 to electrodes of the capacitor and the signal line respectively, according to the circuit design.

However, the prior art method of forming the LTPS-TFT 26 faces a very severe problem of difficulty in controlling the quality of the active polysilicon thin film on the channel region. In addition, many variables during the amorphous silicon thin film formation process and the crystallization process, such as the quality of the as-formed amorphous silicon thin film, the magnitude of the laser energy density, the spatial uniformity of the laser energy, the overlapping ratio of the laser pulse, the substrate temperature during the laser annealing process, and the atmosphere during the laser annealing process, will directly affect the grain size and the grain distribution after the crystallization process is completed. When process is not properly controlled, many small polysilicon thin film grains are generated in the active channel region after crystallization to result in considerable grain boundary.

Please refer to FIG. 5, which is a schematic diagram illustrating small polysilicon thin film grains 38 generated in the channel region 15 of the LTPS-TFT 26 shown in FIG. 3. As shown in FIG. 5, an unsatisfactory laser annealing process generates many polysilicon thin film grains 38 and considerable grain boundary 42 in the channel region 15. When the LTPS-TFT 26 is turned on, the considerable grain boundary 42 will trap electrons flowing through the channel region 15 to reduce the conductive current. When the LTPS-TFT 26 is turned off, electrons will be released to increase the leakage current. By continuous experiments and fine tuning, the crystallization situation of a single LTPS-TFT 26 may satisfy the expected criterion because a qualifying process condition discovered. However, a common laser crystallization process is not able to control the growing sites and the growing orientations of the polysilicon thin film grains 38 on an entire panel, which usually has several hundred thousand pixels or even several millions pixels.

In other words, the grains in the amorphous silicon thin film are randomly distributed resulting in inconsistency of electrical characteristics among the LTPS-TFTS, especially when the size of the low temperature polysillicon thin film transistor is continuously shrunk. Therefore, the process window of the laser crystallization process is usually very narrow. In addition, the laser crystallization process is a low temperature solid crystallization process. Since the solid crystallization usually takes a long time, the grains can only grow to a specific size. The amount of grain boundary is thus difficult to control, bringing limitation to the laser crystallization process.

Therefore, it is very important to develop a new structure to better control the growth sites and the growth orientations of the grains when applying the same laser crystallization process to crystallize the amorphous silicon thin film, to effectively improve the electrical characteristics and the uniformity of the LTPS-TFTS, and to enlarge the process window of the laser crystallization process.

SUMMARY OF INVENTION

It is therefore a primary object of the claimed invention to provide a method of forming a thin film transistor (TFT), especially a method of forming an LTPS-TFT (LTPS TFT) having improved electrical characteristics and reliability.

According to the claimed invention, an LTPS-TFT is formed by forming an amorphous silicon pattern first. The amorphous silicon pattern comprises a first region, a second region, a third region between the first region and the second region, at least one pointed region adjacent to the second region and located on the third region, and at least one channel region located on the third region and between the first region and each pointed region. A laser crystallization process is performed. Since a height of the channel region is smaller than a height of the pointed region, the amorphous silicon thin film in the channel region is completely melted and the amorphous silicon thin film in the pointed region is partially melted under the irradiation of the same laser pulse. Therefore, a residual amorphous silicon seed in the pointed region adjacent to the channel region becomes a site of nucleation to perform super lateral grow toward the completely-melted region. Since a height of the third region is smaller than a height of the channel region, the temperature of the third region not covered by the channel region and the pointed region is higher than the temperature of the fourth region, after the amorphous silicon pattern is irradiated by the laser pulse. As a result, the site of nucleation grows from the channel region toward the third region not covered by the channel region and the pointed region and crystallize as a single crystal silicon grain in each of the channel region.

At least one gate insulating layer and at least one gate electrode are formed across the channel region and on the single crystal silicon grain. A source/drain electrode is formed in the first region and the second region. In addition, each channel region can be adjacent to one pointed region at both sides. When applying the present invention method to a production line, the number of grain boundaries in the channel region is effectively reduced and controlled to improve the carrier mobility and to reduce the leakage current. The electrical characteristics, uniformity, and reliability of the LTPS-TFT structure are thus greatly improved.

The method of forming an LTPS-TFT according to the present invention is to form an amorphous silicon pattern having a specific structure first. A pointed region, a channel region adjacent to the pointed region, and a third region are comprised in the amorphous silicon pattern. Because the pointed region is thicker than the channel region and the channel region is thicker than the third region, the amorphous silicon thin film in the channel region is completely melted and the amorphous silicon thin film in the pointed region is partially melted under the irradiation of the same laser pulse. Consequently, a residual amorphous silicon seed in the pointed region adjacent to the channel region becomes a site of nucleation to perform super lateral grow toward the completely-melted region. Furthermore, the two-dimensional heat dissipation is controlled during the laser crystallization process so that a very large single crystal silicon grain is crystallized in the channel region. As a result, the number of grain boundaries in the channel region is effectively reduced and controlled to improve the carrier mobility and to reduce the leakage current. The electrical characteristics, uniformity, and reliability of the LTPS-TFT structure are thus greatly improved. When applying the present invention method to large sized panels and products having small-sized devices, not only is the process window of the laser crystallization process enlarged, but also the process limitation of the low temperature solid crystallization process is overcome.

These and other objectives of the claimed invention will no doubt become obvious to those of ordinary skill in the art after having read the following detailed description of the preferred embodiment that is illustrated in the various figures and drawings.

DETAILED DESCRIPTION

Figure 1:
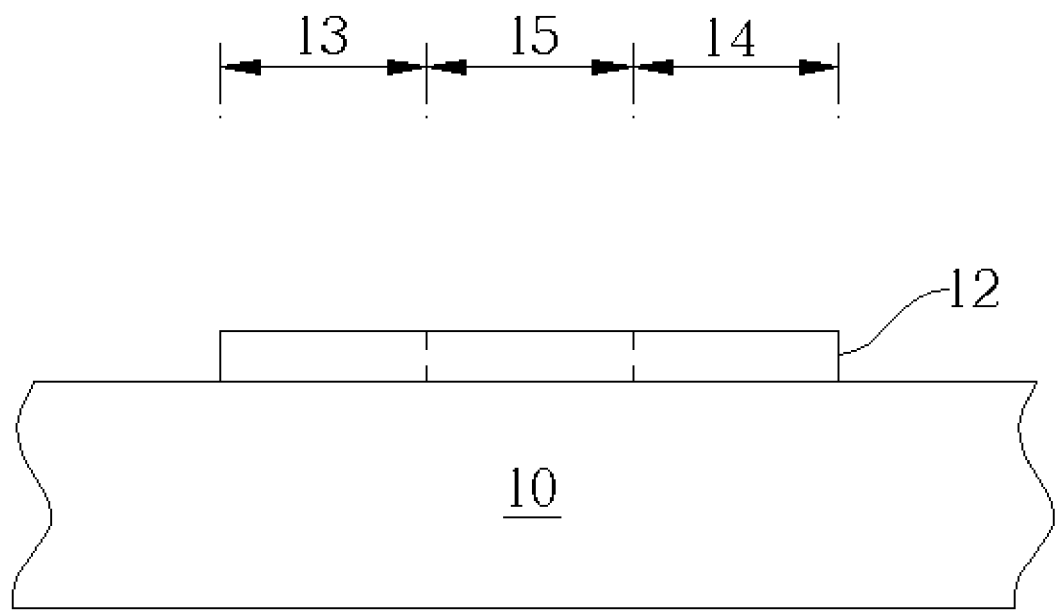
FIG. 1 to FIG. 4 are schematic diagrams of fabricating an LTPS-TFT according to the prior art.
Figure 2:
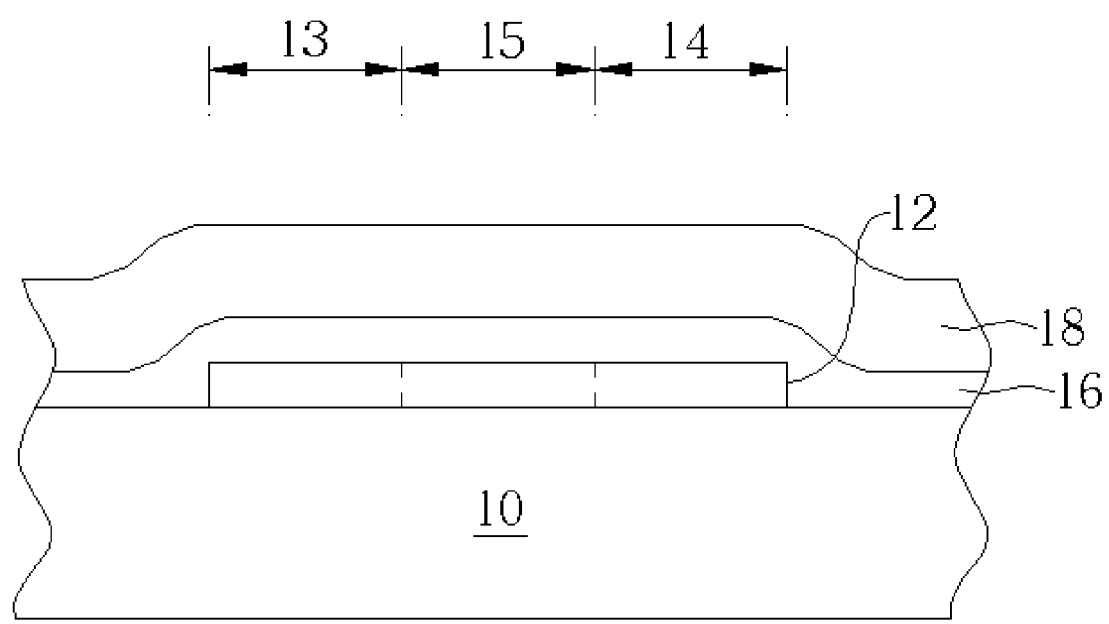
Figure 3:
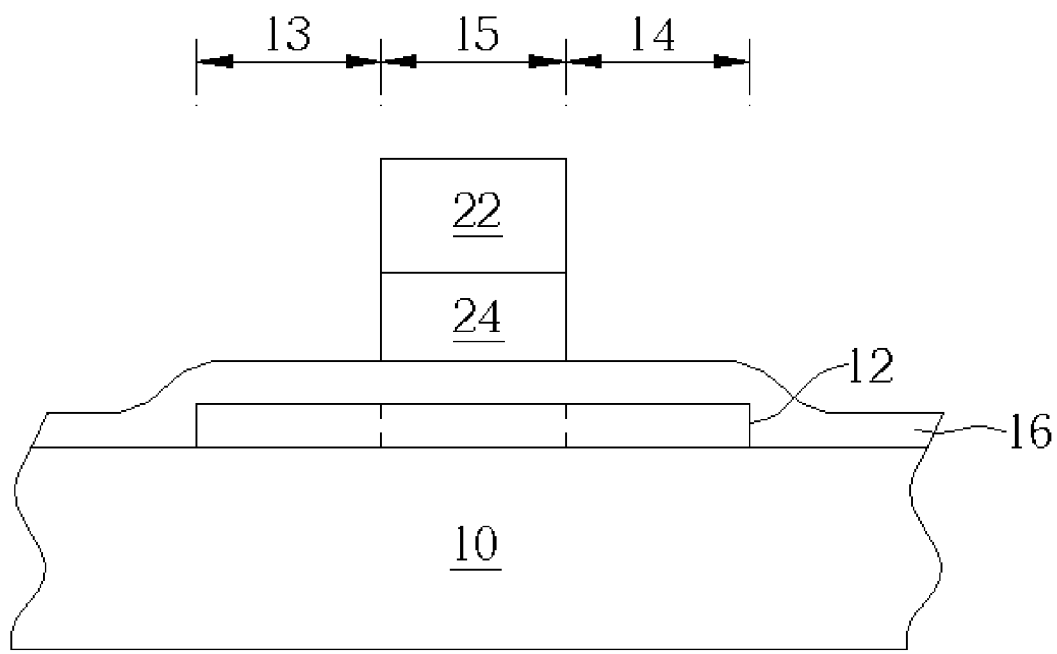
Figure 4:
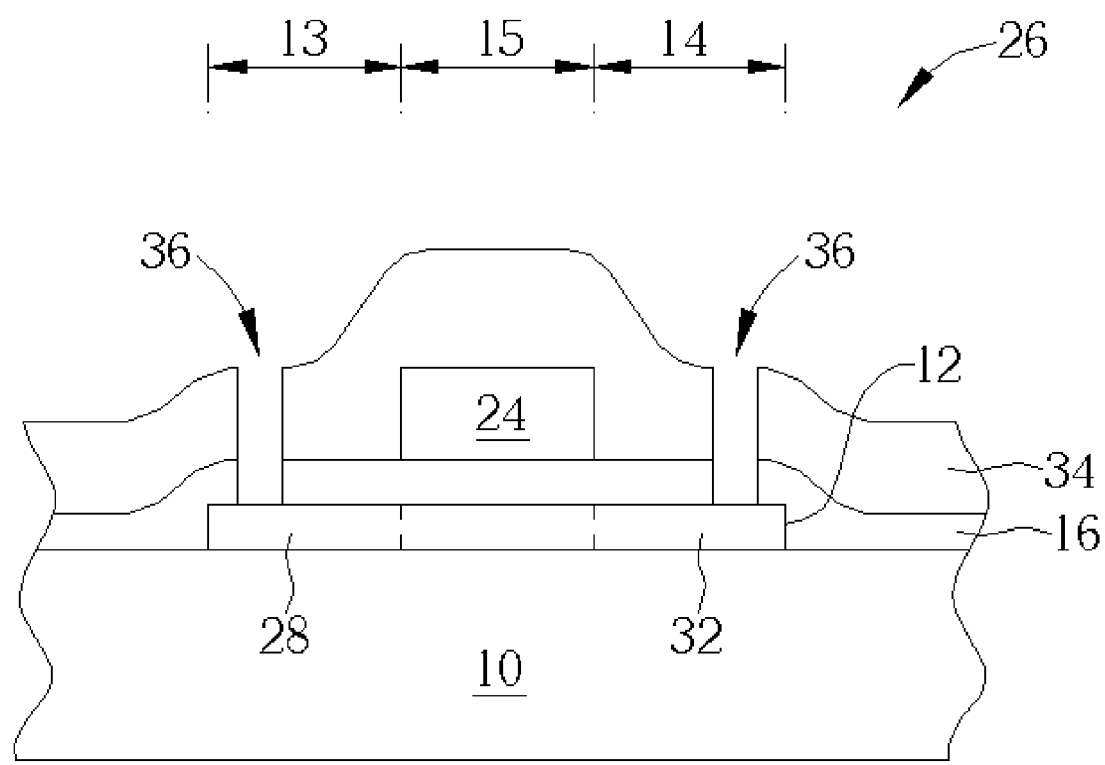
Figure 5:
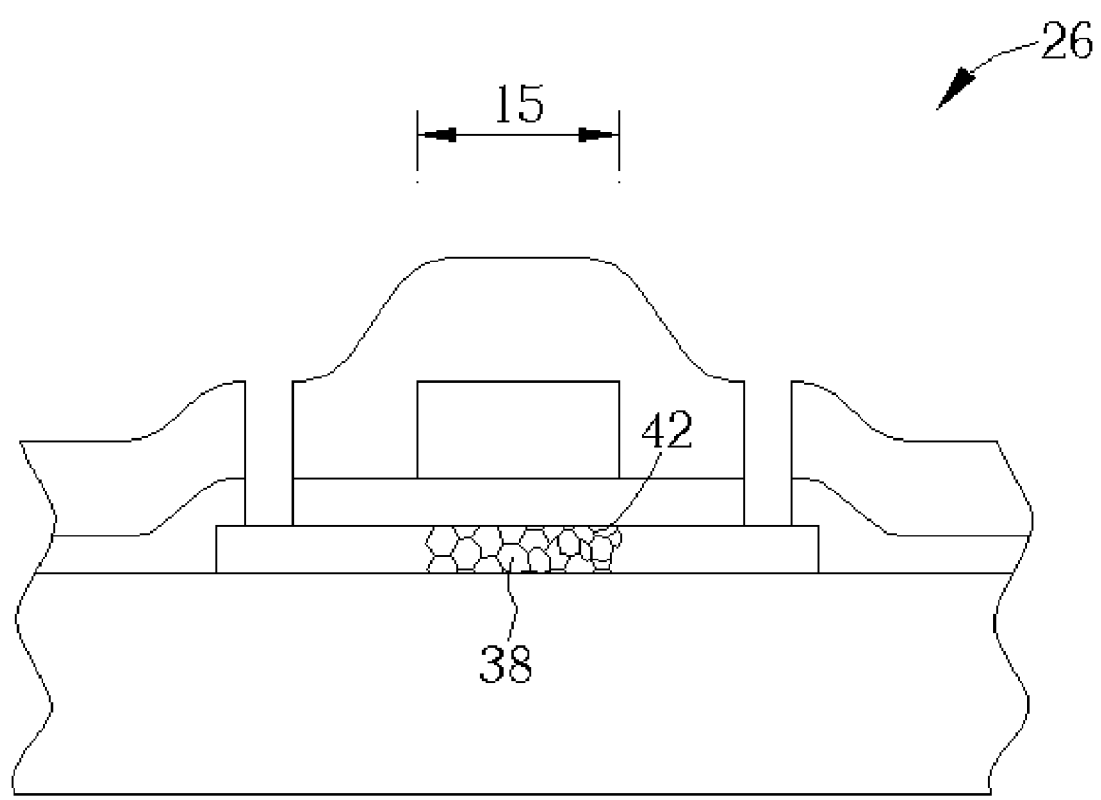
FIG. 5 is a schematic diagram illustrating small polysilicon thin film grains generated in the channel region of the LTPS-TFT shown in FIG. 3.
Figure 6:
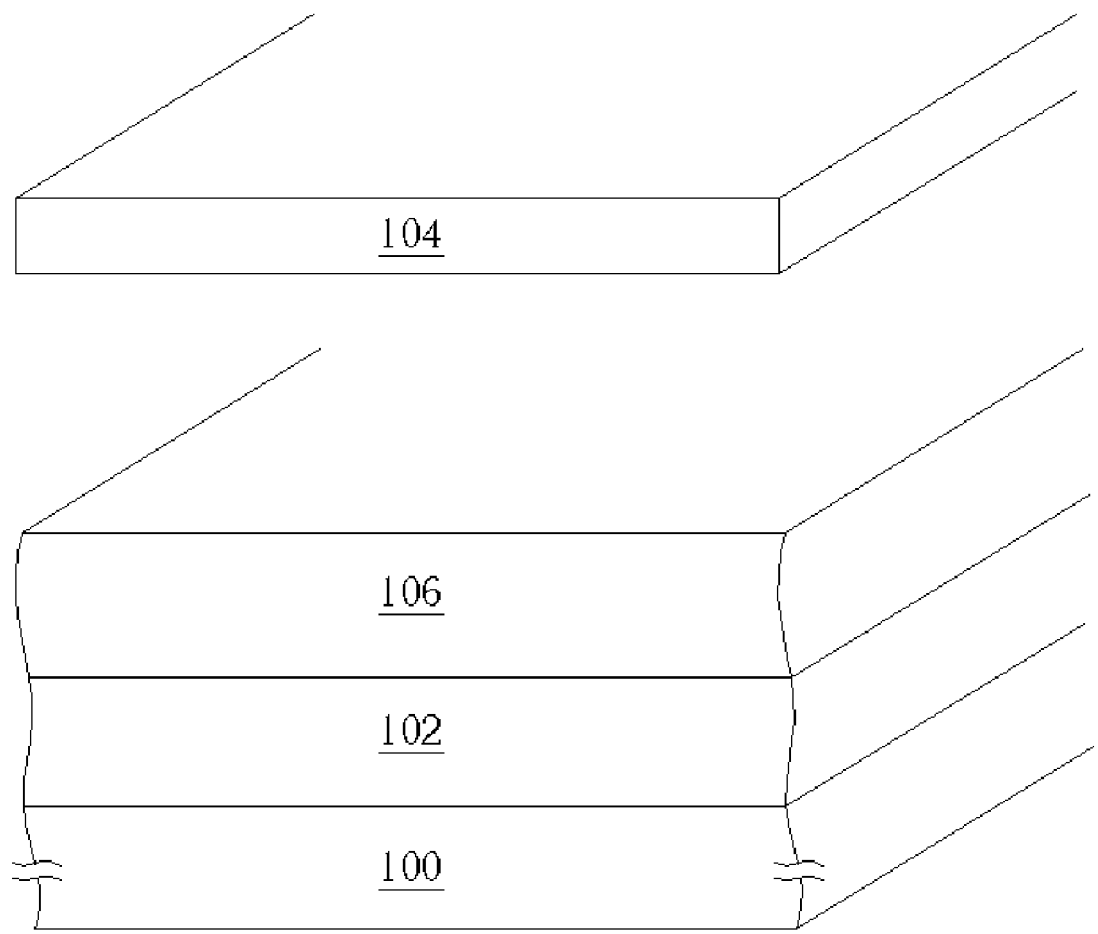
FIG. 6 to FIG. 12 are schematic diagrams of a method of forming an LTPS-TFT according to a first preferred embodiment of the present invention.
Figure 7:
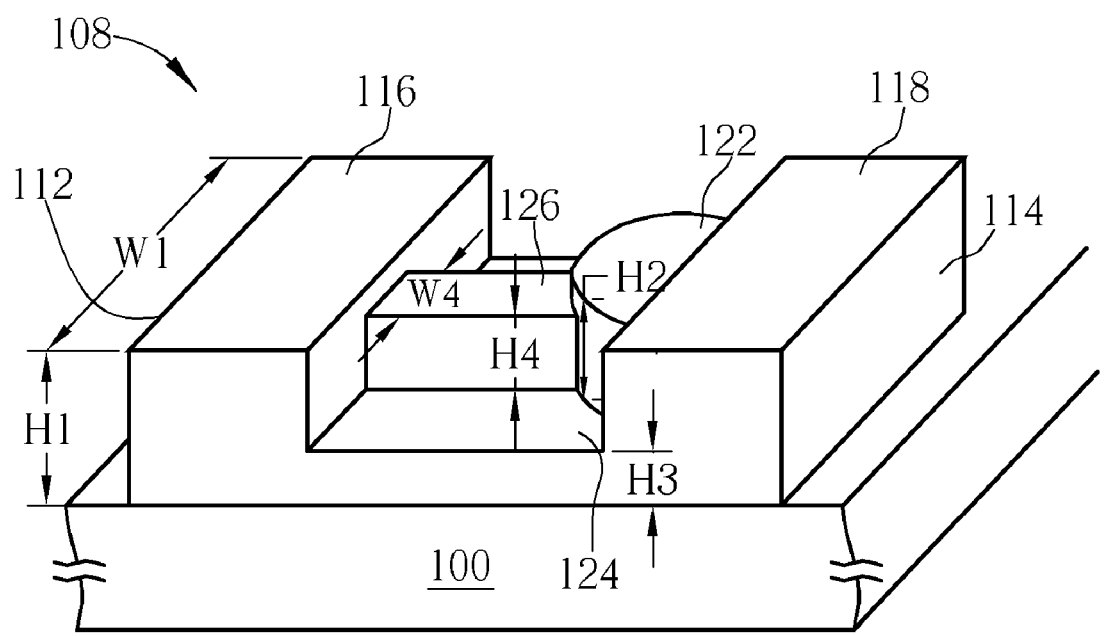

Please refer to FIG. 6 to FIG. 12. These are schematic diagrams of a method of forming an LTPS-TFT 148 according to a first preferred embodiment of the present invention. As shown in FIG. 6, the present invention LTPS-TFT 148 is formed on an insulation substrate 100. The insulation substrate 100, substantially composed of transparent materials, comprises a glass substrate, a quartz substrate, or a plastic substrate. An amorphous silicon thin film (a-Si thin film) 102 is formed on the insulation substrate 100 first. A first photo-etching-process (PEP-1) is then performed to form at least one amorphous silicon pattern (a-Si pattern) 108, as shown in FIG. 7, on the insulation substrate 100 by utilizing a selective mask 104 and a first photoresist layer 106.

The residual photoresist layer 106 is removed. FIG. 7 is a three-dimensional schematic diagram of the amorphous silicon thin film 102 depicted in FIG. 6 after being etched. As shown in FIG. 7, the amorphous silicon pattern 108 comprises a first side 112 and a second side 114. The first side 112 is in parallel with and opposite to the second side 114. The amorphous silicon pattern 108 comprises a first region 116, a second region 118, and a pointed region 122. The first region 116 extends from the first side 112 toward the second side 114, and the second region 118 extends from the second side 114 toward the first side 112. Both the first region 116 and the second region 118 have a first height (H1). The pointed region 122 is adjacent to the second region 118 and extends toward the first side 112. The pointed region 122 has a second height (H2), and the second height (H2) is smaller than the first height (H1).

The amorphous silicon pattern 108 further comprises a third region 124 and a fourth region 126. The third region 124 is located between the first region 116 and the second region 118. The pointed region 122 is located on the third region. The third region 124 has a third height (H3), and the third height (H3) is smaller than the first height (H1). Actually, the first height is substantially equal to the sum of the second height (H2) and the third height (H3).

The fourth region 126 is located on the third region 124 between the first region 116 and the pointed region 122. The fourth region 126 has a fourth height (H4). The fourth height (H4) is smaller than the second height (H2) and greater than the third height (H3). The amorphous silicon pattern 108 is used as an active region of the LTPS-TFT 148. The first region 116 and the second region 118 are a source/drain region of the LTPS-TFT 148, and the fourth region 126 is a channel region of the LTPS-TFT 148. Actually, a width of the third region 124 is substantially equal to a width of the first region 116 and the second region 118 ($W_1$), and a width of the fourth region 126 ($W_4$) is smaller than all of them in this preferred embodiment.

Please cross-reference to FIG. 6 and FIG. 7. The difference between the selective mask 104 and a common mask is that the materials in different regions of the mask have different transmittance. In FIG. 6, the selective mask 104 is illustrated briefly. In fact, the mask material above the first region 116, the second region 118, and the pointed region 122 has the lowest transmittance. The mask material above the third region 124 not covered by the pointed region 122 and the fourth region 126 has the next highest transmittance. The transmittance of the mask material above the fourth region 126 is between the previous two. The mask material in the region not above the amorphous silicon pattern 108 has the highest transmittance. Therefore, once the first photoresist layer 106 is exposed and developed, a step structure having different heights (not shown in FIG. 6) is formed in the first photoresist layer 106. After the etching process, the amorphous silicon pattern 108 having the first region 116, the second region 118, the pointed region 122, the third region 124, and the fourth region 126 is formed. In addition, each of the first/second region 116/118, the pointed region 122, the third region 124, and the fourth region 126 has the different length, the different width, or the different height from one another. Furthermore, the amorphous silicon pattern 108 may be formed by performing repetitive photolithography processes and etching processes and by utilizing common masks and common hard masks.

Figure 8:
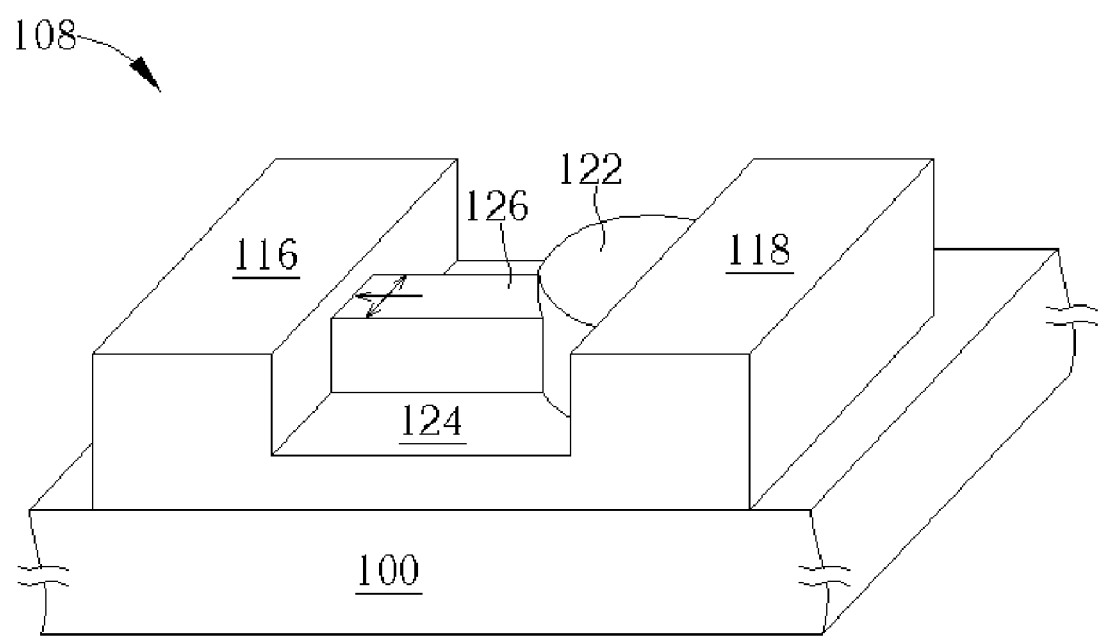

As shown in FIG. 8, a laser crystallization (LC) process is thereafter performed to the amorphous silicon pattern 108. The laser utilized in the laser crystallization process comprises an excimer laser (EL), a gas pulse laser, a solid pulse laser, or a continuous wave laser. By irradiating the amorphous silicon pattern 108 with the laser pulse, the amorphous silicon thin film in the fourth region 126 is completely melted and the amorphous silicon thin film in the pointed region 122 is partially melted because the first region 116, the second region 118, the pointed region 122, the third region 124, and the fourth region 126 have individual thickness and site respectively. More clearly, the thickness of the amorphous silicon thin film in the fourth region 126 is smaller than that in the pointed region 122. At this time, the residual solid silicon, which is an amorphous silicon seed, in the pointed region 122 adjacent to the fourth region 126 becomes a site of nucleation to perform super lateral growth (SLG) toward the completely-melted region (as indicated by one of the arrows).

Figure 11:
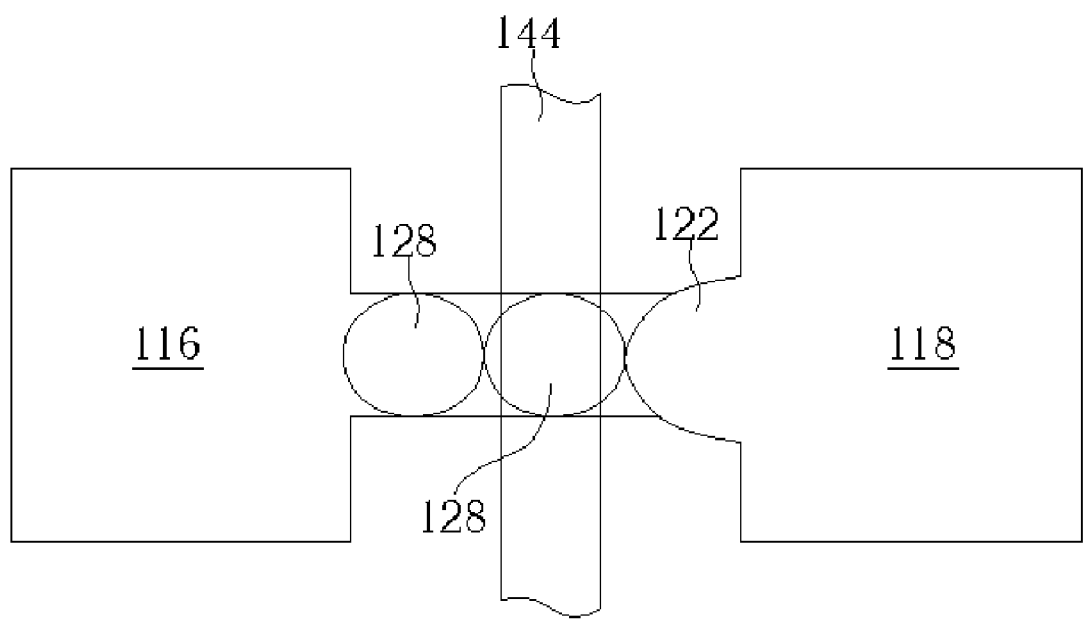

Since the third height is smaller than the fourth height, the temperature of the third region 124 not covered by the fourth region 126 and the pointed region 122 is higher than the temperature of the fourth region 126. Therefore, the site of nucleation grows from the fourth region 126 toward the third region 124 not covered by the fourth region 126 and the pointed region 122 (as indicated by another arrow), after the amorphous silicon pattern 108 is irradiated by the laser pulse, to crystallize as a single crystal silicon grain 128 in the fourth region 126 (as shown in FIG. 11). By utilizing the laser annealing technique, the crystallized grain becomes very large, and parts of the grain orientations are controlled to effectively control the microstructure of parts of grain boundary. This method is thus one kind of the artificially controlled super lateral growth (ACSLG) method. Owing to the pointed region 122, the growth site for the single crystal silicon grain 128 (as shown in FIG. 11) is squeezed into the center to allow a gate lying across the single crystal silicon grain 128 to be consequently formed.

In another respect, the amorphous silicon thin film in the third region 124 not covered by the fourth region 126 and the pointed region 122 is completely melted, and the amorphous silicon thin film in the first region 116 and the second region 118 is partially melted, when the amorphous silicon pattern 108 is irradiated by the laser pulse. At this time, a plurality of amorphous silicon seeds in the first region 116 and the second region 118 will grow toward the completely-melted region to crystallize as a plurality of polysilicon grains (not shown) in the third region 124 not covered by the fourth region 126 and the pointed region 122. Moreover, the amorphous silicon thin film in the third region 124 covered by the fourth region 126 and the pointed region 122 is partially melted after the laser crystallization process. Since the microstructure in this region after the laser crystallization process is not a key point in the present invention, it is not mentioned redundantly. Finally, the amorphous silicon thin film in the amorphous silicon pattern 108 is crystallized into a patterned polysilicon layer 134, as shown in FIG. 9.

As mentioned previously, since the quality of the amorphous silicon thin film 102 is a determinative factor for the characteristics of the subsequent formed patterned polysilicon layer 134, all of the parameters during the amorphous silicon thin film 102 deposition process need to be strictly controlled. The amorphous silicon thin film 102 with low hydrogen content, high thickness uniformity, and low surface roughness is thus formed. Moreover, the amorphous silicon thin film 102 is melted and crystallized rapidly through absorption of the deep ultraviolet light during the laser crystallization process to form the patterned polysilicon layer 134. Such a quick absorption due to the short laser pulse only affects the amorphous silicon thin film 102 and will not affect the insulation substrate 100. Hence, the insulation substrate 100 is kept at a low temperature state.

Figure 9:
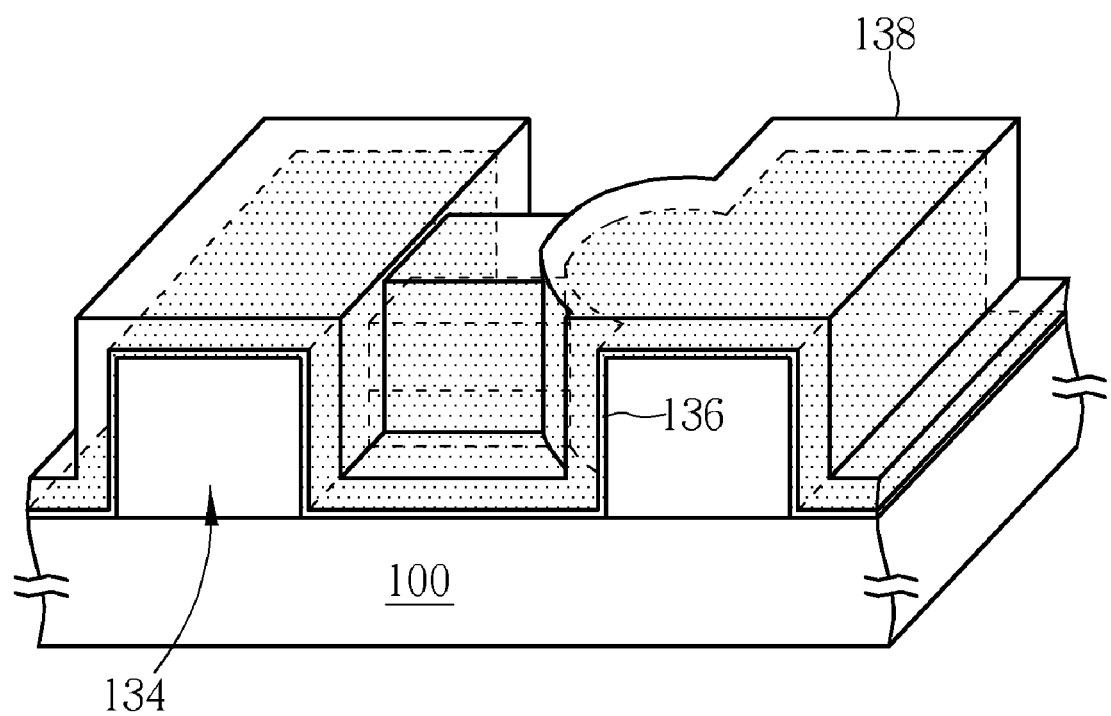

As shown in FIG. 9, the patterned polysilicon layer 134 in the third region 124 (some amorphous silicon structure may be retained at the bottom of the patterned polysilicon layer) is removed. The patterned polysilicon layer 134 in the third region 124 may be removed by anisotropically etching the patterned polsyilicon layer 134 until the patterned polysilicon layer 134 in the third region 124 is etched up. Alternatively, a mask is utilized to define the third region 124 and followed by an etching process to remove the patterned polysilicon layer 134 in the third region 124. After that, at least one plasma enhanced chemical vapor deposition (PECVD) process is performed to form at least one dielectric layer 136 on the insulation substrate 100. The material composition of each dielectric layer 136 comprises silane-based silicon oxide ($SiH_4$-based $SiO_x$), tetra-ethyl-orthosilicate based silicon oxide (TEOS-based $SiO_x$), silicon nitride ($SiN_x$), or silicon oxynitride ($SiO_xN_y$). A sputtering process is then performed to form a metal layer 138 on the dielectric layer 136 and the patterned polysilicon layer 134. The metal layer 138 may be a tungsten (W) layer, a chrome (Cr) layer, or another conductive metal layer.

Figure 10:
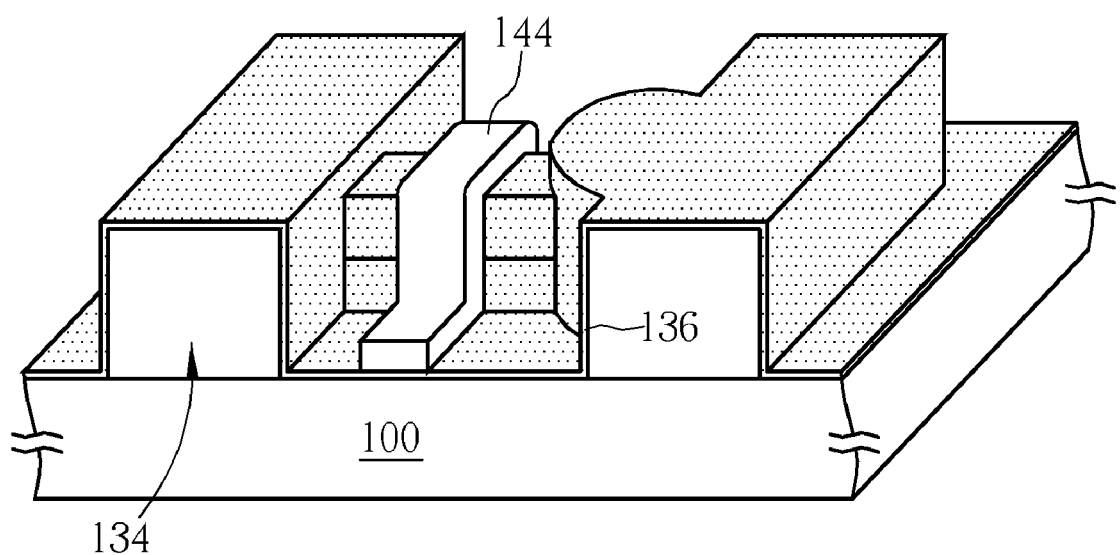

Referring to FIG. 10 and FIG. 11, FIG. 11 is a top view of FIG. 10. As shown in FIG. 10 and FIG. 11, a photoresist layer (not shown) is thereafter coated on the insulation substrate 100. After that, a photolithography process is performed to define a gate pattern (not shown) in the photoresist layer (not shown). The gate pattern (not shown) lays across the channel region (the fourth region 126) and is on the single crystal silicon grain 128. Then, a dry etching process is performed to remove portions of the metal layer 138 to form a gate 144 on the dielectric layer 136. It is worth noticing that each dielectric layer 136 may be etched up or partially etched by utilizing the gate 144 as a hard mask when performing the dry etching process. However, the dielectric layer 136 between the gate 144 and the patterned polysilicon layer 134 is used as a gate insulating layer of the LTPS-TFT 148.

Figure 12:
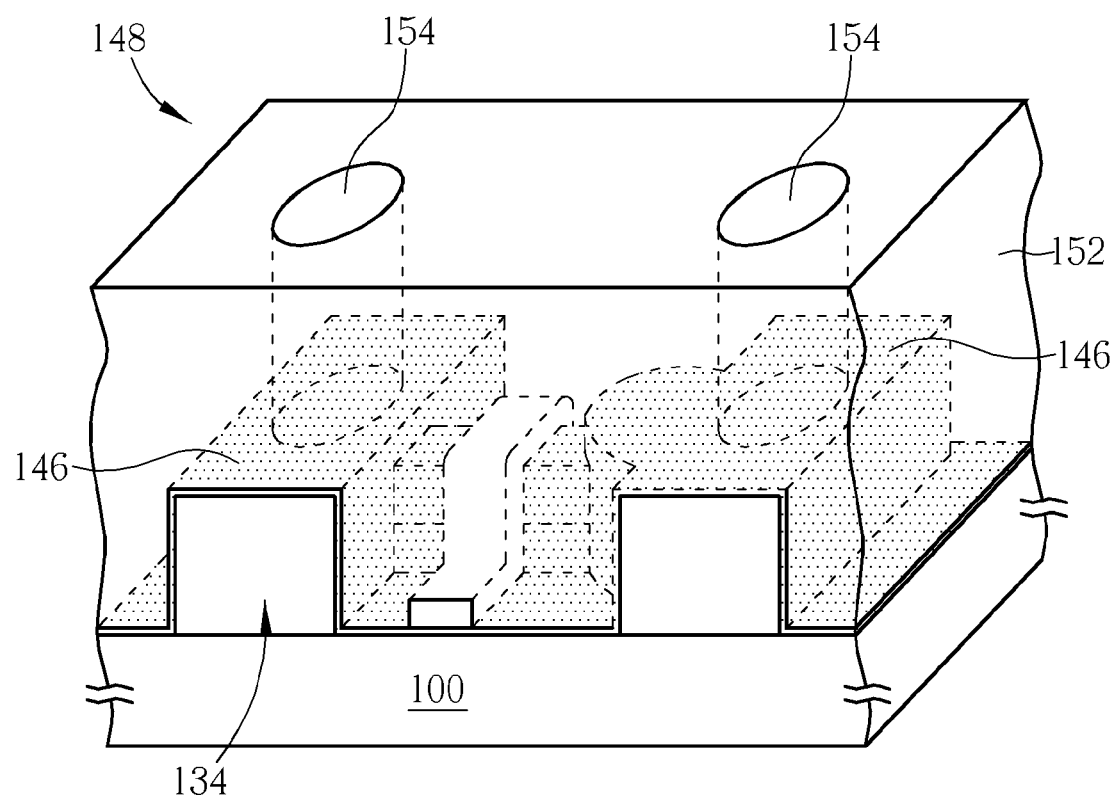

The gate pattern (not shown) is removed. An ion implantation process is thereafter performed to form a source/drain 146 of the LTPS-TFT 148 in the source/drain regions in the patterned polysilicon layer 134 (the first region 116 and the second region 118) respectively by utilizing the gate 144 as a mask, as shown in FIG. 12. In the thin film transistor (TFT), the series resistance of the source/drain must be low. An activation process is thus necessarily performed after the ion implantation process to highly activate the dopants in the source/drain 146. The activation process not only moves the ions to the correct lattice sites but also repairs the lattice defects incurred from the ion implantation process to complete the fabrication of the LTPS-TFT 148.

After completing the LTPS-TFT 148, a dielectric layer 152 is deposited. The dielectric layer 152 may be a single-layered dielectric layer or a composite-layered dielectric layer. Finally a second photo-etching-process (PEP-2) is performed to form a contact hole 154 through the dielectric layer 152 (and other dielectric layer, not shown), on the source/drain 146, extending to the source/drain 146, respectively. The contact hole 154 is filled with conductive materials to electrically connect the source/drain 146 to the electrode of the capacitor and the signal line respectively, according to the circuit design.

Figure 13:
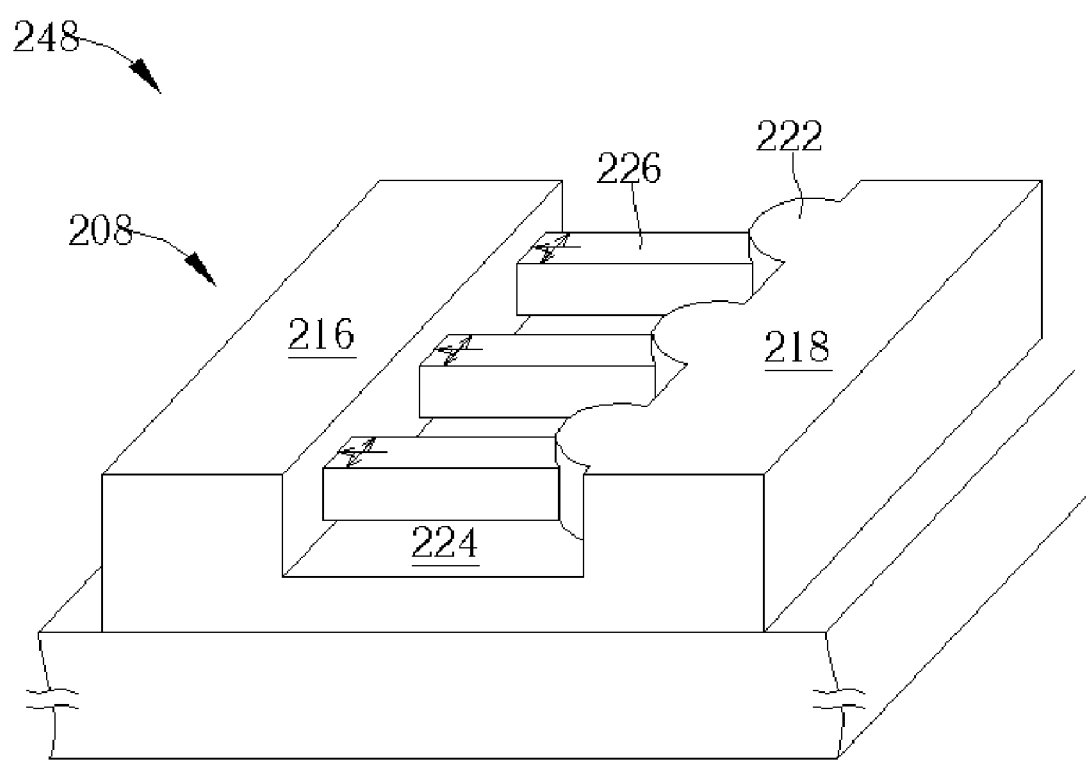
FIG. 13 is a three-dimensional schematic diagram of an LTPS-TFT formed according to a second preferred embodiment of the present invention.

FIG. 13 is a three-dimensional schematic diagram of an LTPS-TFT 248 formed according to a second preferred embodiment of the present invention. The difference between the second preferred embodiment and the first preferred embodiment is that a plurality of fourth regions 226 (three are taken as example in FIG. 13) are included on a third region 224 in the second preferred embodiment shown in FIG. 13. Each of the fourth regions 226 is adjacent to a pointed region 222. When an amorphous silicon pattern 208 is irradiated by an laser pulse, the amorphous silicon thin film in the fourth regions 226 is completely melted and the amorphous silicon thin film in the pointed regions 222 is partially melted because a first region 216, a second region 218, the pointed region 222, the third region 224, and the fourth region 226 have individual thickness and site respectively. More clearly, the thickness of the amorphous silicon thin film in the fourth regions 226 is smaller than that in the pointed regions 222.

At this time, the residual solid silicon, which is an amorphous silicon seed, in each of the pointed regions 222 adjacent to the corresponding fourth region 226 becomes a site of nucleation to perform super lateral growth (SLG) toward the completely-melted region (as indicated by the arrows). In addition, since a height of the third region 224 is smaller than a height of the fourth region 226, the temperature of the third region 224 not covered by the fourth regions 226 and the pointed regions 222 is higher than the temperature of the fourth regions 226, after the amorphous silicon pattern 208 is irradiated by the laser pulse. Therefore, the nucleation sites grow from the fourth regions 226 toward the third region 224 not covered by the fourth regions 226 and the pointed regions 222 (as indicated by the arrows) and crystallize as a single crystal silicon grain (not shown) in each of the fourth regions 226, which is used as a channel region. A gate insulating layer (not shown) and a gate (not shown) are included on each of the fourth regions 226. The first region 216 and the second region 218, doped with dopants, are used as a source/drain, respectively. The gate (not shown) may be a line-shaped structure orthogonal to the fourth regions 226, or a structure in another shape. In the second preferred embodiment of the present invention, the total channel width is three times the channel width in the first preferred embodiment of the present invention.

Figure 14:
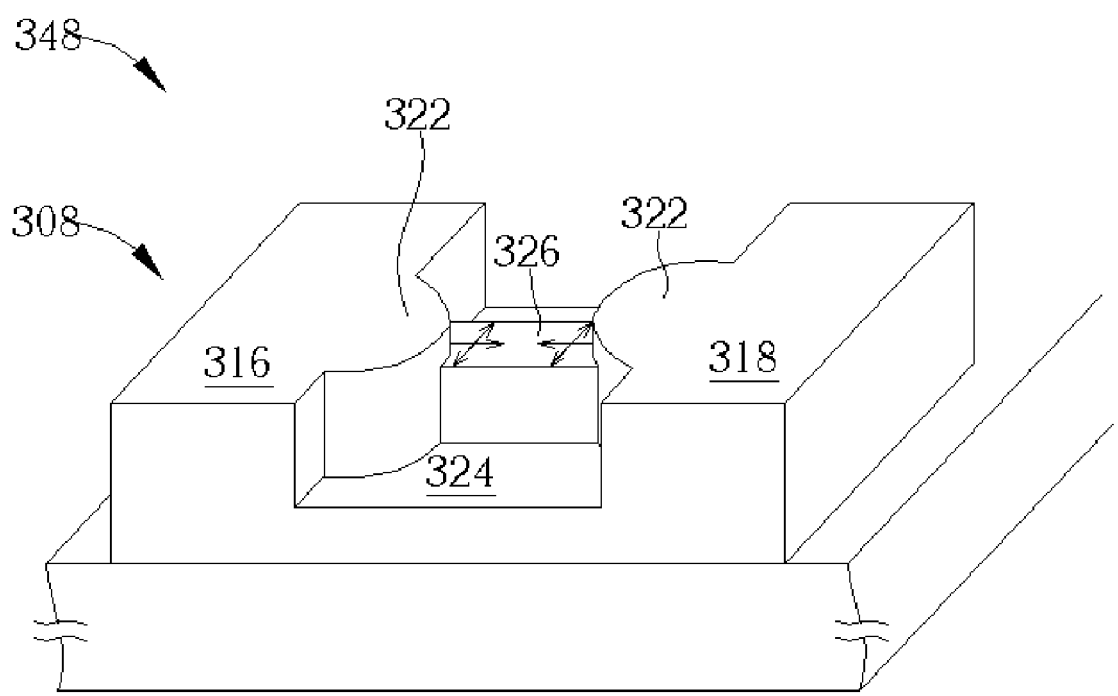
FIG. 14. is a three-dimensional schematic diagram of an LTPS-TFT formed according to a third preferred embodiment of the present invention.

FIG. 14 is a three-dimensional schematic diagram of an LTPS-TFT 348 formed according to a third preferred embodiment of the present invention. A difference between the third preferred embodiment and the first preferred embodiment is that two symmetric pointed regions 322 are included on a third region 324 in the third preferred embodiment, as shown in FIG. 14. Therefore, a fourth region 326 is adjacent to the pointed regions 322 at both sides. When an amorphous silicon pattern 308 is irradiated by an laser pulse, the amorphous silicon thin film in the fourth region 326 is completely melted and the amorphous silicon thin film in the pointed regions 322 is partially melted because a first region 316, a second region 318, the pointed region 322, the third region 324, and the fourth region 326 have individual thickness and site respectively. More clearly, the thickness of the amorphous silicon thin film in the fourth regions 326 is substantially smaller than that in the pointed regions 322.

At this time, the residual solid silicon, which is two single amorphous silicon seeds in the two pointed regions 322 adjacent to the fourth region 326, becomes sites of nucleation to perform super lateral growth (SLG) toward the completely-melted region (as indicated by the arrows). In addition, since a height of the third region 324 is smaller than a height of the fourth region 326, the temperature of the third region 324 not covered by the fourth region 326 and the pointed regions 322 is higher than the temperature of the fourth region 326 after the amorphous silicon pattern 308 is irradiated by the laser pulse. Therefore, the sites of nucleation grow from the fourth region 326 toward the third region 324 not covered by the fourth region 326 and the pointed regions 322 (as indicated by the arrows) and crystallize as two single crystal silicon grains (not shown) in the fourth region 326, which is used as a channel region. A gate insulating layer (not shown) and a gate (not shown) are included on the fourth region 326. The first region 316 and the second region 318, doped with dopants, are used as a source/drain, respectively. The gate (not shown) may be a forked structure orthogonal to the fourth region 326 and above the two single crystal silicon grains (not shown), or a structure in another shape. The LTPS-TFT 348 formed according to the third preferred embodiment of the present invention is applied to specific processing and specific products.

The method of forming the LTPS-TFT according to the present invention is to form an amorphous silicon pattern having a specific structure first. Due to the thickness differences among the pointed region, the channel region, and the third region, the amorphous silicon thin film in the channel region and in the pointed region being different melted status under the irradiation of the same laser pulse. Therefore, a residual amorphous silicon seed in the pointed region immediately adjacent to the channel region becomes a site of nucleation to perform super lateral grow toward the completely-melted region. Furthermore the two-dimensional heat dissipation is controlled during the laser crystallization process so that a very large single crystal silicon grain is formed in the channel region.

In addition, the present invention method can be practiced by various means. For example, to form a plurality of channel regions in one active region, to form a double gate structure in one channel region, or even to form a plurality of channel regions having a double gate structure in one active region. When applying the present invention method to a production line, the number of grain boundaries in the channel region is effectively reduced and controlled to improve the carrier mobility and to reduce the leakage current. The electrical characteristics, uniformity, and reliability of the LTPS-TFT structure are thus greatly improved. When applying the present invention method to large sized panels and products having small-sized devices, not only is the process window of the laser crystallization process enlarged, but also the process limitation of the low temperature solid crystallization process is overcome.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a silicon thin film comprising the steps of:
   providing a substrate;
   forming an amorphous silicon (a-Si) pattern on the substrate,
      wherein the amorphous silicon pattern comprising:
      a first region having a first height;
      a second region having the first height;
      at least one first pointed region being adjacent to the second region, each first pointed region having a second height;
      a third region, the third region being located between the first region and the second region, each first pointed region being located on the third region, the third region having a third height; and
      at least one fourth region, each fourth region being located on the third region between the first region and each first pointed region, each fourth region having a fourth height smaller than the second height and greater than the third height; and
   performing the laser crystallization process to allow an amorphous silicon seed in each first pointed region adjacent to each fourth region to grow and to crystallize as a first single crystal silicon grain in each fourth region.

2. The method of claim 1 wherein the substrate comprises a glass substrate, a quartz substrate, or a plastic substrate.

3. The method of claim 1 wherein the first height is substantially equal to the sum of the second height and the third height.

4. The method of claim 1 wherein a second pointed region is comprised between the first region and each fourth region, and each second pointed region has a fifth height greater than the fourth height.

5. The method of claim 4 wherein the first height is substantially equal to the sum of the fifth height and the third height, and the third height is smaller than the fourth height.

6. The method of claim 4 wherein an amorphous silicon seed in each second pointed region adjacent to each fourth region grows to crystallize as a second single crystal silicon grain in each fourth region when the laser crystallization process is performed.

7. The method of claim 1 wherein the laser crystallization process is to irradiate the amorphous silicon pattern with a laser pulse to completely melt the amorphous silicon thin film in each fourth region and to partially melt the amorphous silicon thin film in each first pointed region so that the residual solid silicon in each first pointed region adjacent to each fourth region becomes a site of nucleation to perform super lateral growth (SLG).

8. The method of claim 7 wherein the temperature of the third region not covered by each fourth region and each first pointed region is higher than the temperature of each fourth region so that each site of nucleation grows from each fourth region toward the third region not covered by each fourth region and each first pointed region after the amorphous silicon pattern is irradiated by the laser pulse.

9. The method of claim 8 wherein the laser crystallization process is to irradiate the amorphous silicon pattern with the laser pulse to completely melt the amorphous silicon thin film in the third region not covered by each fourth region and each first pointed region and to partially melt the amorphous silicon thin film in the first region and the second region so that a plurality of amorphous silicon seeds in the first region and the second region grow to crystallize as polysilicon grains in the third region not covered by each fourth region and each first pointed region.

10. The method of claim 1 wherein the amorphous silicon thin film in the third region covered by each fourth region and each first pointed region is partially melted after the laser crystallization process is performed.

11. The method of claim 1 wherein the laser comprises an excimer laser, a gas pulse laser, a solid pulse laser, or a continuous wave laser.

12. The method of claim 1 further comprising the following steps after performing the laser crystallization process:
   forming at least one gate insulating layer on each fourth region; and
   forming at least one patterned gate electrode on the gate insulating layer on each fourth region.

13. The method of claim 12 wherein the first region and the second region are a source/drain region of a thin film transistor, and the fourth region is a channel region of the thin film transistor.

14. The method of claim 13 further comprising the following steps after forming each gate electrode:
   performing an ion implantation process to form source/drain electrodes of the thin film transistor in the first region and the second region by utilizing each of the gate electrodes as a mask; and performing an activation process to activate the dopants in the source/drain electrodes of the thin film transistor.

15. The method of claim 13 wherein the thin film transistor is a low temperature polysilicon thin film transistor (LTPS TFT).

16. The method of claim 12 further comprising the following steps when forming each gate insulating layer:

performing at least one plasma enhanced chemical vapor deposition (PECVD) process to form at least one dielectric layer on the substrate.

17. The method of claim 16 wherein the material composition of each dielectric layer comprises silane-based silicon oxide, tetra-ethyl-ortho-silicate based silicon oxide, silicon nitride, or silicon oxynitride.

18. The method of claim 12 wherein the material composition of each gate electrode comprises tungsten (W), chrome (Cr), or other conductive metal.

19. A method of forming a silicon thin film comprising the steps of:

providing a substrate;

forming an amorphous silicon (a-Si) pattern on the substrate wherein the amorphous silicon pattern comprising:

a first region having a first height;

a second region having the first height;

at least one first pointed region being adjacent to the second region, each first pointed region having a second height;

a third region, the third region being located between the first region and the second region, each first pointed region being located on the third region, the third region having a third height;

at least one fourth region, each fourth region being located on the third region between the first region and each first pointed region, each fourth region having a fourth height smaller than the second height and greater than the third height;

performing the laser crystallization process to allow an amorphous silicon seed in each first pointed region adjacent to each fourth region to grow and to crystallize as a first single crystal silicon grain in each fourth region;

forming at least one gate insulating layer on each fourth region; and forming at least one patterned gate electrode on the gate insulating layer on each fourth region.

20. The method of claim 19 wherein the first region and the second region are a source/drain region of a thin film transistor, and the fourth region is a channel region of the thin film transistor.

21. The method of claim 20 further comprising the following steps after forming each gate electrode:

performing an ion implantation process to form source/drain electrodes of the thin film transistor in the first region and the second region by utilizing each of the gate electrodes as a mask; and performing an activation process to activate the dopants in the source/drain electrodes of the thin film transistor.

22. The method of claim 20 wherein the thin film transistor is a low temperature polysilicon thin film transistor (LTPS TFT).

23. The method of claim 19 further comprising the following steps when forming each gate insulating layer:

performing at least one plasma enhanced chemical vapor deposition (PECVD) process to form at least one dielectric layer on the substrate.

24. The method of claim 23 wherein the material composition of each dielectric layer comprises silane-based silicon oxide, tetra-ethyl-ortho-silicate based silicon oxide, silicon nitride, or silicon oxynitride.

25. The method of claim 19 wherein the material composition of each gate electrode comprises tungsten (W), chrome (Cr), or other conductive metal.

* * * * *